(12) United States Patent
Kalio et al.

(10) Patent No.: US 10,834,813 B2
(45) Date of Patent: Nov. 10, 2020

(54) FLEXIBLE ELECTRICAL CIRCUIT HAVING CONNECTION BETWEEN ELECTRICALLY CONDUCTIVE STRUCTURE ELEMENTS

(71) Applicant: Schreiner Group GmbH & Co. KG, Oberschleissheim (DE)

(72) Inventors: André Kalio, Neubiberg (DE); Michael Haeussler, Munich (DE); Christian Mechtler, Munich (DE)

(73) Assignee: Schreiner Group GmbH & Co. KG, Oberschleissheim (DE)

( * ) Notice: Subject to any disclaimer, the term of this patent is extended or adjusted under 35 U.S.C. 154(b) by 0 days.

(21) Appl. No.: 16/245,284

(22) Filed: Jan. 11, 2019

(65) Prior Publication Data

US 2019/0223284 A1    Jul. 18, 2019

(30) Foreign Application Priority Data

Jan. 18, 2018 (DE) .......................... 10 2018 101 101
Feb. 7, 2018 (DE) .......................... 10 2018 102 734

(51) Int. Cl.
| | |
|---|---|
| *H05K 1/00* | (2006.01) |
| *H05K 1/02* | (2006.01) |
| *H01R 12/61* | (2011.01) |
| *H05K 1/09* | (2006.01) |
| *H05K 3/46* | (2006.01) |

(52) U.S. Cl.
CPC ............. *H05K 1/028* (2013.01); *H01R 12/61* (2013.01); *H05K 1/0298* (2013.01); *H05K 1/09* (2013.01); *H05K 3/4682* (2013.01); *H05K 2201/0355* (2013.01); *H05K 2201/10151* (2013.01)

(58) Field of Classification Search
CPC ...... H01R 12/61; H05K 1/028; H05K 1/0298; H05K 1/09; H05K 2201/0355; H05K 2201/10151; H05K 3/361; H05K 3/4682
See application file for complete search history.

(56) References Cited

U.S. PATENT DOCUMENTS

| | | | | |
|---|---|---|---|---|
| 4,343,851 A | * | 8/1982 | Sheptak | B32B 27/08 428/212 |
| 5,466,892 A | * | 11/1995 | Howard | H05K 1/0239 174/250 |
| 5,484,648 A | * | 1/1996 | Odashima | H01R 4/04 428/209 |

(Continued)

FOREIGN PATENT DOCUMENTS

| | | |
|---|---|---|
| DE | 10 2009 018 285 A1 | 11/2010 |
| DE | 20 2014 103 821 U1 | 9/2014 |

(Continued)

*Primary Examiner* — Yuriy Semenenko
(74) *Attorney, Agent, or Firm* — Collard & Roe, P.C.

(57) ABSTRACT

A flexible electrical circuit having connection between electrically conductive structure elements includes at least one lacquer layer, at least one electrical conductor track, which is disposed above the at least one lacquer layer, and at least one electrically conductive contact layer for contacting at least one electrical component. Furthermore, the flexible electrical circuit includes a conductive cement layer and a layer of a primer. The layer of the primer is disposed on the at least one lacquer layer. The conductive cement layer is disposed underneath the at least one electrically conductive contact layer and above the layer of the primer.

15 Claims, 3 Drawing Sheets

(56) References Cited

U.S. PATENT DOCUMENTS

| | | | |
|---|---|---|---|
| 10,098,223 B2 | 10/2018 | Seidl et al. | |
| 2007/0237932 A1* | 10/2007 | Shvartsman | B32B 27/08 428/204 |
| 2008/0202661 A1 | 8/2008 | Kobayashi | |
| 2010/0085258 A1* | 4/2010 | Teshima | H01Q 1/243 343/700 MS |
| 2012/0032910 A1* | 2/2012 | Kim, II | G06F 3/03547 345/174 |
| 2012/0315800 A1* | 12/2012 | Tseng | H01R 12/63 439/676 |
| 2013/0041235 A1* | 2/2013 | Rogers | A61B 5/1107 600/306 |
| 2013/0135838 A1 | 5/2013 | Tsukao et al. | |
| 2016/0014884 A1* | 1/2016 | Diegel | H05K 1/0393 174/254 |
| 2018/0249573 A1* | 8/2018 | Becker | H05K 1/0239 |

FOREIGN PATENT DOCUMENTS

| | | | |
|---|---|---|---|
| DE | 10 2015 113 928 A1 | | 2/2017 |
| DE | 102015113928 | * | 2/2017 |
| WO | 99/60829 A2 | | 11/1999 |
| WO | 2016/004921 A1 | | 1/2016 |

\* cited by examiner

FLEXIBLE ELECTRICAL CIRCUIT HAVING CONNECTION BETWEEN ELECTRICALLY CONDUCTIVE STRUCTURE ELEMENTS

CROSS REFERENCE TO RELATED APPLICATIONS

Applicant claims priority under 35 U.S.C. § 119 of German Application No. 10 2018 101 101.6 filed on Jan. 18, 2018 and German Application No. 10 2018 102 734.6 filed on Feb. 7, 2018, the disclosures of which are incorporated by reference.

BACKGROUND OF THE INVENTION

The invention relates to a flexible electrical circuit having a connection between electrically conductive structure elements, especially between an electrical conductor track, which is disposed on a carrier material, and an electrically conductive contact layer, which is disposed on the underside of an electrical component or on the underside of a carrier layer, for example a flexible printed circuit board.

Using a cement layer, which is disposed on an underside of the flexible circuit, a flexible electrical circuit can be applied in simple manner on a body, for example on a medicine package. The flexible electrical circuit may be provided with a carrier material, for example a lacquer layer, on which the one electrical conductor track is disposed. The flexible electrical circuit further comprises electrical components, which must be connected to the conductor track electrically as well as mechanically.

In one possible embodiment of the flexible electrical circuit, an electrical component or respectively an electrically conductive contact layer (pad), which is disposed on the underside of the electrical component and which functions to transmit electrical signals from the electrical conductor track via the electrically conductive contact layer to the electrical component, must be connected electrically and mechanically to the conductor track. Furthermore, the electrical component must be fixed mechanically on the remaining carrier materials, especially the at least one lacquer layer, of the flexible electrical circuit.

In another embodiment of a flexible electrical circuit, the electrical components are disposed on a carrier layer, for example a flexible printed circuit board. Electrically conductive contact faces are connected electrically to the electrical components on the upper side of the carrier layer. Such electrically conductive contact faces may be provided on the back side of the carrier layer. In this case, the electrically conductive contact layers on the underside of the carrier layer must be connected electrically and mechanically to the at least one electrical conductor track. Furthermore, the carrier layer must be fixed mechanically on the remaining carrier materials, especially the at least one lacquer layer, of the flexible circuit.

Such a flexible electrical circuit may be integrated in simple manner into a further electrical circuit or an article, for example a package, especially a medicine package, by adhesively bonding the flexible electrical circuit together with its adhesive layer on, for example, a printed circuit board of the further electrical circuit or on the article, for example the package.

In such a flexible electrical circuit, the connection between the electrically conductive structure elements, especially between the electrical conductor tracks and the electrically conductive contact layers for contacting the electrical components, is a weak link, at which the flexible electrical circuit can be easily damaged, with the result that the electrical functionality is no longer assured.

SUMMARY OF THE INVENTION

One concern of the present invention is to specify a flexible electrical circuit having a secure connection between electrically conductive structure elements.

In accordance with one embodiment of the invention, such a flexible electrical circuit having a secure and reliable connection between electrically conductive structure elements of the flexible electrical circuit is provided.

The flexible electrical circuit comprises at least one lacquer layer, at least one electrical conductor track disposed above the at least one lacquer layer, at least one electrical component, and at least one electrically conductive contact layer for contacting the at least one electrical component. Furthermore, the flexible electrical circuit comprises a conductive cement layer and a layer of a primer. The layer of the primer is disposed on the at least one lacquer layer. The conductive cement layer is disposed underneath the at least one electrically conductive contact layer and above the layer of the primer.

In the inventive flexible electrical circuit, the layer of the primer is disposed between the at least one lacquer layer and the conductive cement layer. The conductive cement layer is disposed between the at least one electrically conductive contact layer and the layer of the primer.

In one possible embodiment, the at least one electrical component is disposed directly on the conductive cement layer. In this embodiment, the at least one electrical component is fixed mechanically to the at least one lacquer layer by the conductive cement layer and the layer of the primer. Because of the layer of the primer, the at least one electrical component adheres securely to the at least one lacquer layer via the conductive cement layer. The layer of the primer permits a strong mechanical adhesion between the at least one lacquer layer and the conductive cement layer or respectively the at least one electrical component.

In another embodiment, the at least one electrical component is disposed on a carrier layer. In this embodiment, the carrier layer is adhesively bonded on the layer of the primer by means of the conductive cement layer. The carrier layer is therefore mechanically fastened by the conductive cement layer and the layer of the primer to the at least one lacquer layer. The carrier layer may be, for example, a flexible foil, a flexible printed circuit board or a rigid printed circuit board. The at least one electrical component may be disposed on the upper side or the underside or on both sides of the carrier layer. The at least one electrically conductive contact layer may be disposed on the underside of the carrier layer. Because of the layer of the primer, the carrier layer adheres securely to the at least one lacquer layer via the conductive cement layer. The layer of the primer permits a strong mechanical adhesion between the at least one lacquer layer and the conductive cement layer or respectively the carrier layer.

The flexible electrical circuit has a low failure rate upon the action of mechanical forces on the connecting junction between the at least one lacquer layer and the at least one electrical component or respectively the carrier layer, because the at least one electrical component or respectively the carrier layer adheres firmly to the at least one lacquer layer, especially due to the provision of the layer of the primer. The flexible electrical circuit arrangement of the at least one lacquer layer, the layer of primer, which is applied on the at least one lacquer layer, the conductive cement layer, which functions as the connecting layer to the at least one electrically conductive contact layer or to the at least one electrical component or to the carrier layer, has a stronger adhesive force than if the conductive cement layer were applied directly on the at least one lacquer layer and no primer were provided. Consequently, a reliable electrical as well as mechanical connection also exists between the at least one electrically conductive contact layer and the electrical conductor track.

The flexible electrical circuit may be part of a sensor arrangement. Such a sensor arrangement comprises a flexible electrical circuit according to one of the above-mentioned embodiments and a substrate. Using a cement layer, which is disposed on an underside of the flexible electrical circuit, the flexible electrical circuit may be adhesively bonded on the substrate. The substrate may be a package, especially a medicine package.

BRIEF DESCRIPTION OF THE DRAWINGS

Other objects and features of the invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF PREFERRED EMBODIMENTS

Figure 1:
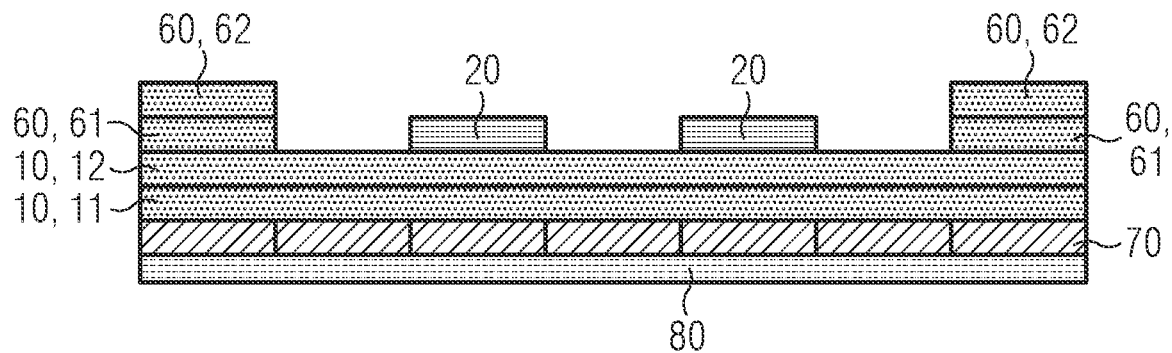
FIG. 1 shows a first embodiment of a layer arrangement having electrical conductor tracks.

The layer arrangement shown in FIG. 1 has at least one lacquer layer 10, for example of a UV-curing polyurethane material. The at least one lacquer layer 10 may comprise, for example, the lacquer layers 11 and 12 shown in FIG. 1. In the illustrated exemplary embodiment of the upper lacquer layer 12, at least one electrical conductor track 20 is disposed on an upper side of the at least one lacquer layer 10. In the exemplary embodiment of the layer arrangement illustrated in FIG. 1, two electrical conductor tracks 20 are disposed on regions of the upper side of the at least one lacquer layer 10. The conductor tracks 20 may be designed as contact faces, which contain, for example, carbon or silver (silver pads).

In the region of the illustrated connecting junction, the at least one electrical conductor track 20 is freely accessible upwardly and is no longer covered by further lacquer layers. For increase of the stability of the layer structure, or for insulation, at least one further lacquer layer 60 may be provided in further regions of the layer arrangement. Parts of the conductor track 20 that are situated distantly from the connecting junction are covered with a lacquer layer, for example the further lacquer layer 60. In the illustrated exemplary embodiment, the at least one further lacquer layer 60 comprises two lacquer layers 61 and 62.

Figure 2:
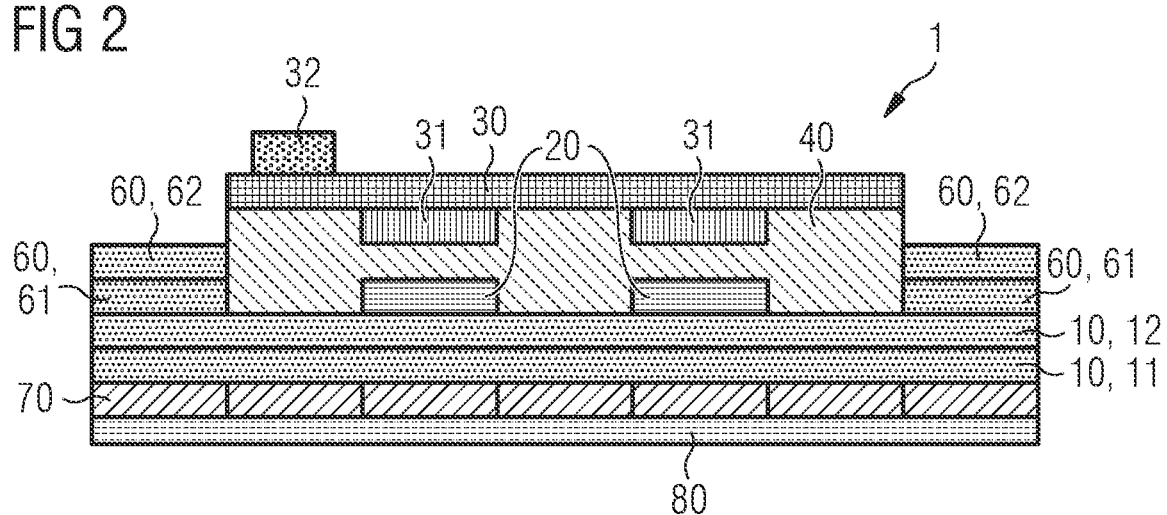
FIG. 2 shows a first embodiment of a flexible electrical circuit having connection between electrically conductive structure elements.

In comparison with the layer arrangement illustrated in FIG. 1, a carrier layer 30, for example a flexible carrier foil or respectively flexible printed circuit board or a rigid printed circuit board is disposed above the at least one lacquer layer 10 or respectively the electrical conductor tracks 20 in the first embodiment, illustrated in FIG. 2, of a flexible electrical circuit 1 having connection between electrically conductive structure elements. At least one electrical component 32 and at least one electrically conductive contact layer 31 for contacting the at least one electrical component 32 may be disposed on the carrier layer 30. The at least one electrically conductive contact layer 31 may be designed as a contact face which contains, for example, gold (gold pad). The contact face 31 may be provided with, for example, a composition of copper, nickel and gold. According to one possible embodiment, the at least one contact layer 31 may be designed as a silver layer or as a copper layer, which is coated with a gold or tin or zinc layer.

For adhesive bonding of the flexible electrical circuit on an article, for example on a package, especially a medicine package or on a printed circuit board for integration into a further electrical circuit, a cement layer 70 is disposed on an underside of the at least one lacquer layer 10. In the circuit structure illustrated in FIG. 1, the cement layer 70 is disposed underneath the lacquer layer 11. The cement layer 70 is covered by a protective foil 80 for protection of the cement layer 70. The protective foil 80 may be designed as a peelable foil (covering liner).

For adhesive bonding of the carrier layer 30 onto the at least one lacquer layer 10 and the electrical conductor tracks 20, a conductive cement layer 40 (see FIG. 2) is disposed on the upper side of the at least one lacquer layer 10 and on the at least one electrical conductor track 20. At its underside, the carrier layer 30 adheres to the conductive cement layer 40.

In the illustrated embodiment, an anisotropic conductive cement paste (ACP cement) or an anisotropic conductive cement film (ACF cement) may be used for the conductive cement layer 40. When the conductive cement layer 40 is disposed only between the electrically conductive contact layer 31 and the electrical conductor track 20, an isotropic conductive cement and possibly a soldering process may also be used. The cement or the solder is applied on the electrical conductor tracks 20 locally, for example by dispensers, by screen printing or by stencil printing or by other application methods. In the process, an electrical and mechanical connection is established between each of the electrical conductor tracks 20, for example the silver pads, and each of the electrically conductive contact layers 31, for example the gold pads.

It has also been found, however, that only a weak adhesion exists between the at least one lacquer layer 10 and the carrier layer 30 due to the conductive cement layer 40.

Especially during use of a conductive cement layer 40 of an anisotropic cement, a good adhesion is indeed present between the electrically conductive contact layer 31 and the electrical conductor track 20. Ultimately, however, only a weak adhesion exists between the carrier layer 30 and the at least one lacquer layer 10, because the conductive cement 40 has only a weak adhesion effect on the at least one lacquer layer 10.

During use of an isotropic cement, which is applied only between the electrical conductor track 20 and the at least one electrically conductive contact layer 31, a further weak link may be present in terms of the adhesion between the electrical conductor track 20 and the at least one lacquer layer 10.

In addition, during use of an isotropic cement, the danger of short circuits between neighboring electrically conductive contact layers 31 (pads) of the carrier layer 30 exists due to a possible flow of the conductive cement layer 40, which cures under pressure and temperature effect.

During use of an anisotropic conductive cement layer, the adhesion between the carrier layer 30 and the at least one lacquer layer 10 or respectively the electrical conductor track 20 cannot be improved. Despite use of an anisotropic conductive cement layer 40 of various basic components, for example on polycarbamic acid derivative basis or on epoxy basis, only a weak adhesion still exists between the conductive cement layer 40 and the at least one lacquer layer 10. This weak adhesion may be attributed in particular to silicone particles, which may be present at the interface to the conductive cement layer 40 and thus reduce the adhesion, being contained in the at least one lacquer layer 10.

In the structure of a flexible electrical circuit shown in FIG. 2, or even in an embodiment in which the carrier layer 30 is omitted and the at least one electrical component 32, together with an electrically conductive contact layer 31 attached to its underside, is disposed directly on the conductive cement layer 40, an increased risk of failures exists during the assembly process, the dispensing process and the later use of the flexible electrical circuit. This increased risk is to be attributed to the ability of the carrier layer 30 having the at least one electrical component 32 or, in the case of the direct arrangement of the at least one electrical component 32 on the conductive cement layer 40, of the at least one electrical component 32 to be detached relatively easily from the underlying layers of the circuit arrangement, especially the at least one lacquer layer 10.

Figure 3:
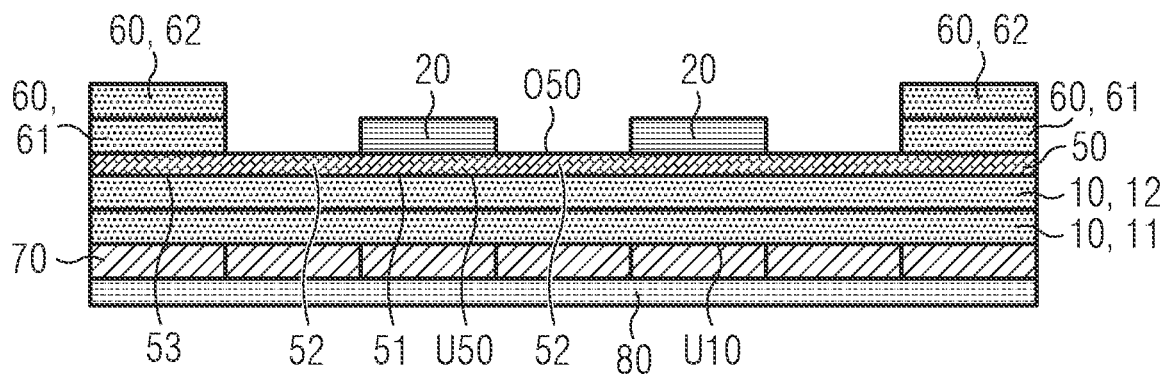
FIG. 3 shows a second, improved embodiment of a layer arrangement having electrical conductor tracks.

FIG. 3 shows a second, improved embodiment of a layer arrangement. The layer arrangement comprises at least one upper lacquer layer 10 and at least one electrical conductor track 20, which is disposed above the at least one lacquer layer 10. The at least one lacquer layer 10 may be designed as a transfer lacquer with a high mechanical stability. With respect to its properties, the at least one lacquer layer 10 is designed to be tear-resistant, stretchable and transferable.

The at least one lacquer layer may be a polymer layer, which is printed from a liquid phase. The at least one lacquer layer 10 may contain, for example, polyurethane or latex/rubber. The at least one lacquer layer 10 may contain, for example, a UV curing polyurethane. According to one possible embodiment, the at least one lacquer layer may contain a printing ink, a casting resin, a potting compound or an adhesive. The at least one lacquer layer 10 may be provided with a lower lacquer layer 11 and an upper lacquer layer 12. In the layer structure shown in FIG. 3, the at least one electrical conductor track 20 is provided with two electrical conductor tracks, which are disposed above the at least one lacquer layer 10. The at least one electrical conductor track 20 may be designed as an electrically conductive contact face which, for example, contains carbon or silver (silver pads).

Figure 4A:
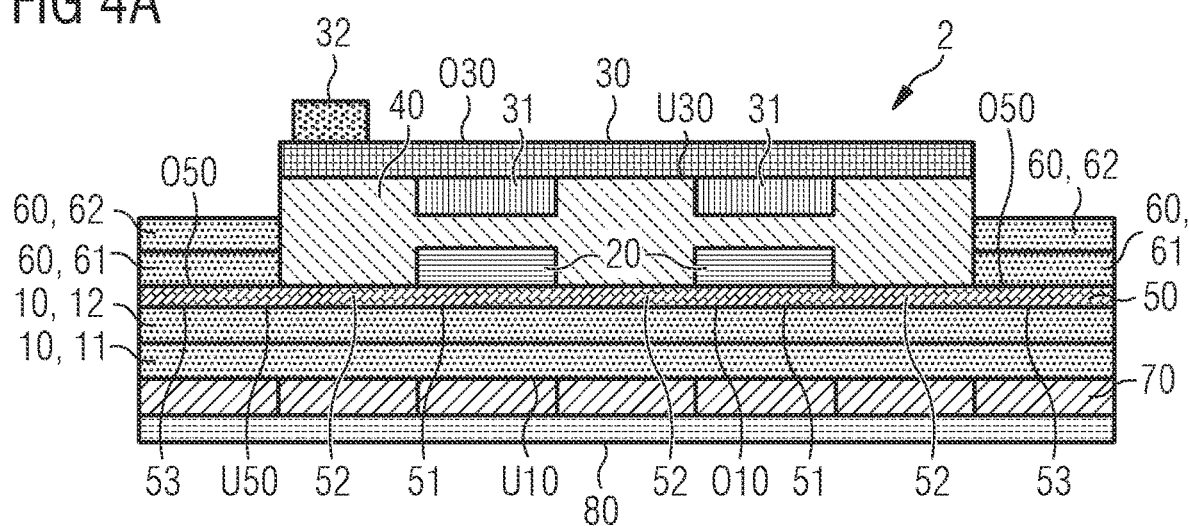
FIG. 4A shows a second, improved embodiment of a flexible electrical circuit having connection between electrically conductive structure elements.
Figure 4B:
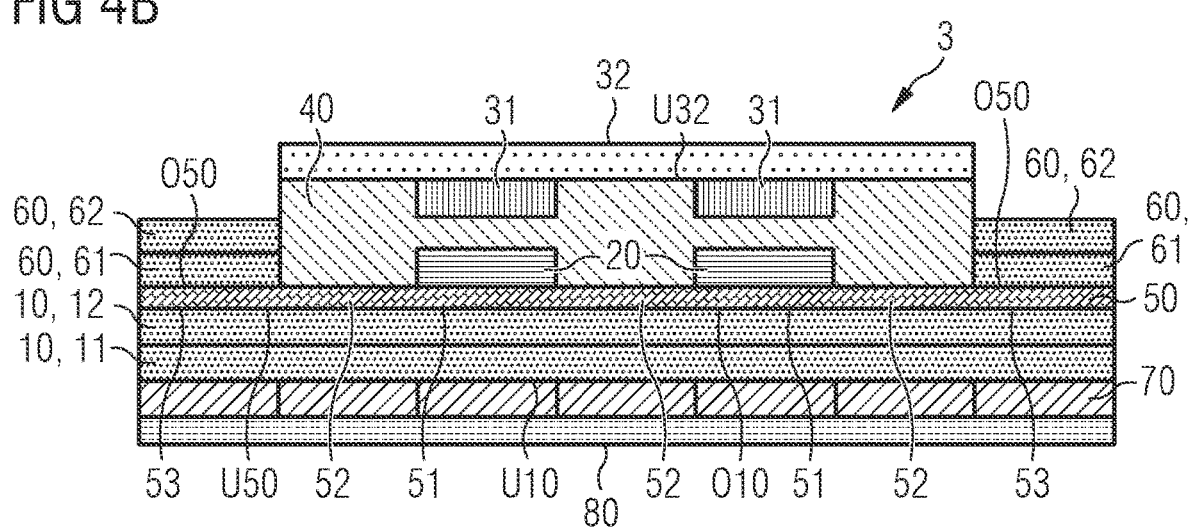
FIG. 4B shows a third, improved embodiment of a flexible electrical circuit having connection between electrically conductive structure elements.

In FIG. 4A, a second, improved embodiment of a flexible electrical circuit 2 is illustrated that has connection between electrically conductive structure elements. In FIG. 4B, a third, improved embodiment of a flexible electrical circuit 3 is illustrated that has connection between electrically conductive structure elements. The flexible electrical circuit comprises the structure shown in FIG. 3.

The flexible electrical circuit has a cement layer 70 for adhesive bonding of the circuit on an article. Using the cement layer 70, the flexible electrical circuit may be integrated, for example, into a further electrical circuit, by adhesively bonding the flexible electrical circuit via the cement layer 70 on a printed circuit board of the further electrical circuit. Furthermore, the flexible electrical circuit may be cemented or incorporated, for example, into a package, for example a medicine package. The cement layer 70 is disposed on an underside U10 of the at least one lacquer layer 10. For protection of the cement layer 70, the circuit structure may be provided with a protective foil 80, which is disposed as a peelable foil (cover liner) underneath the cement layer 70. This foil is, for example, electrically conductive.

In contrast to the flexible electrical circuit shown in FIGS. 1 and 2, the second and third embodiments of the flexible electrical circuit 2, 3 comprises a layer 50 of a primer in addition to the conductive cement layer 40. The layer 50 of the primer has adhesion-promoting properties and may reduce the flow of the conductive cement under temperature effect. According to one possible embodiment, the primer layer may be provided with a solvent-based acrylate lacquer. According to another embodiment, the primer layer may be, for example, a polyolefin primer or a silane primer. Further metalloorganic primers, for example zirconates and titanates as well as zirconium aluminates, may be used for the primer. The layer 50 of the primer is disposed on the at least one lacquer layer 10.

The layer 50 of the primer is disposed directly on the at least one lacquer layer 10. The layer 50 of the primer is thinner than the at least one lacquer layer 10. The primer layer 50 may have a layer thickness of, for example, between 1 μm and 15 μm. The at least one lacquer layer 10 usually has a layer thickness between 10 μm and 50 μm.

The flexible electrical circuit 2 further comprises at least one electrical component 32. The at least one electrical component 32 may be a passive or active electrical device. In particular, it may be a microcontroller, a battery, a communication chip, diode or an antenna.

According to the embodiment shown in FIG. 4A, the flexible electrical circuit 2 comprises a carrier layer 30, on which the at least one electrical component 32 is disposed. The at least one electrical component 32 may be disposed on an upper side O30 or an underside U30 of the carrier layer 30. At least one electrically conductive contact layer 31 for contacting the at least one electrical component 32 is disposed on an underside U30 of the carrier layer 30. The carrier layer 30 is disposed on the conductive cement layer 40. The carrier layer 30 is disposed directly on the conductive cement layer 40. The conductive cement layer 40 is disposed between the carrier layer 30 and the layer 50 of the primer. The conductive cement layer 40 may be disposed on the upper side of the primer layer 50 or respectively on the upper side of the conductor track 20 or on the underside of the carrier layer 30. The carrier layer 30 is therefore adhesively bonded by the conductive cement layer 40 to the layer 50 of the primer and adheres via the primer to the at least one lacquer layer 10. Furthermore, the at least one electrically conductive contact layer 31 is also disposed on the conductive cement layer 40.

The conductive cement layer 40 and also the layer 50 of the primer function for mechanical connection of the carrier layer 30 to the at least one lacquer layer 10. The carrier layer 30 may contain an electronic circuit. The carrier layer 30 may be in particular a flexible printed circuit board, a flexible foil or a rigid printed circuit board.

According to the embodiment of the electrical circuit 3 shown in FIG. 4B, the at least one electrical component 32 is disposed directly on the conductive cement layer 40. In comparison with the embodiment shown in FIG. 4A, the carrier layer 30 is omitted. The underside U32 of the at least one electrical component 32 is disposed on the conductive cement layer 40. Furthermore, at least one electrically conductive contact layer 31 for contacting the electrical component 32 is disposed on the underside U32 of the electrical component 32. The at least one electrically conductive contact layer 31 is disposed on the conductive cement layer 40. The conductive cement layer 40 is disposed between the at least one electrical component 32 and the layer 50 of the primer.

Due to the provision of the primer layer 50 on the at least one lacquer layer 10, the at least one electrical component 32 adheres reliably to the at least one lacquer layer 10. In comparison with an embodiment in which the conductive cement layer 40 is disposed directly on the at least one lacquer layer 10, the adhesion is also significantly improved in the embodiment shown in FIG. 4B.

For electrical contacting of the at least one electrical component 32 and the electrical conductor track 20, the conductive cement layer 40 in the embodiment shown in FIGS. 4A and 4B is disposed between the at least one electrically conductive contact layer 31 and the electrical conductor track 20. The conductive cement layer 40 is disposed underneath the at least one electrically conductive contact layer 31 and above the layer 50 of the primer. The conductive cement layer 40 is disposed between the at least one electrically conductive contact layer 31 and the layer 50 of the primer.

The at least one electrically conductive contact layer 31 may be designed as a silver layer or as a copper layer, which is coated with a gold or tin or zinc layer. In particular, the at least one electrically conductive contact layer 31 may be designed as a copper layer, which is coated with nickel and gold. The at least one electrically conductive contact layer 31 may be disposed, for example, as a gold-plated contact face (gold pad) on the underside U30 of the carrier layer 30 or on the underside of the at least one electrical component 32.

The layer 50 of the primer may be disposed selectively or completely on the at least one lacquer layer 10. In the embodiments of the flexible electrical circuit 2 and 3 shown in FIGS. 4A and 4B, the layer 50 of the primer is applied over the entire surface of the at least one lacquer layer 10. The layer 50 of the primer is disposed in particular between the at least one lacquer layer 10 and the at least one electrical conductor track 20. Thus the electrical conductor track 20 is disposed directly on the primer layer 50.

According to one possible embodiment, the primer layer 50 may replace at least one of the layers 11 and 12 of the at least one lacquer layer 10. As an example, a primer having a polyurethane (PU) lacquer may be used.

According to the embodiment illustrated in FIGS. 4A and 4B, the flexible electrical circuit may have not only at least one lacquer layer 10 but also at least one further lacquer layer 60. The at least one further lacquer layer 60 is disposed on an upper side O50 of the layer 50 of the primer. In the exemplary embodiments illustrated in FIGS. 4A and 4B, the further lacquer layer 60 is provided with the lacquer layers 61 and 62. Whereas the at least one lacquer layer 10, especially the lacquer layer 12, is disposed on an underside U50 of the layer 50 of the primer, the lacquer layers 61 and 62 are disposed one above the other on the layer 50 of the primer. The at least one further lacquer layer 60 may contain, for example, a UV-curable polyurethane or 2-component or solvent-based materials.

The layer 50 of the primer has a region 51 and a region 52. The region 52 is disposed on both sides of the region 51. The electrical conductor track 20 is disposed on the upper side O50 of the region 51 of the primer layer 50. The conductive cement layer 40 is disposed on the upper side O50 of the region 52 of the primer layer 50. In addition, the primer layer 50 has a region 53. The region 53 is disposed next to the region 52 of the primer layer 50. The at least one further lacquer layer 60 is disposed on the upper side O50 of the region 53 of the layer 50 of the primer.

In contrast to the embodiment of a flexible electrical circuit 1 shown in FIG. 2, the embodiments of the flexible electrical circuit 2 and 3 shown in FIGS. 4A and 4B have a strong adhesive force between the carrier layer 30 (FIG. 4A) or respectively the at least one electrical component 32 (FIG. 4B) and the at least one lacquer layer 10. This strong adhesive force is due to the conductive cement 40 not being disposed directly, as it is in the embodiment shown in FIG. 2, on the at least one lacquer layer 10. Instead, the flexible electrical circuits 2 and 3 of FIGS. 4A and 4B have the primer layer 50, which is disposed on the upper side O10 of the at least one lacquer layer 10. The conductive cement layer 40 therefore adheres directly to the primer layer 50. The layer 50 of the primer adheres better and more strongly to the at least one lacquer layer 10 than to the conductive cement layer 40. Furthermore, the electrical conductor track 20 adheres better to the layer 50 of the primer than to the conductive cement layer 40.

Due to the connection between the primer layer 50 and the conductive cement layer 40, the carrier layer 30 in the embodiment shown in FIG. 4A and also the at least one electrical component 32 in the embodiment shown in FIG. 4B therefore adheres reliably to the at least one lacquer layer 10. In particular, in comparison with the embodiment of the flexible circuit shown in FIG. 2, a strong adhesive force occurs between the carrier layer 30 or respectively the at least one electrical component 32 and the at least one lacquer layer 10. This strong adhesive force is present in particular when a snap cure conductive cement is used as the conductive cement 40.

As a consequence of the strong adhesive forces between the carrier layer 30 or the at least one electrical component 32, the conductive cement 40, the layer 50 of the primer and the at least one lacquer layer 10, and also due to the improved adhesive force between the electrical conductor track 20 and the layer 50 of the primer, the flexible electrical circuit is characterized by a low failure rate under the effect of mechanical influences. The primer layer 50 exhibits a mechanical and chemical resistance at temperatures up to 200° C., and so a shelf life of several years is assured.

The at least one lacquer layer 10, the electrical conductor track 20, the conductive cement layer 40 and the primer layer 50 may be applied one over the other by a printing method, for example by flexographic printing, inkjet printing or screen printing, or by additive methods, for example spraying or by means of slit nozzles. During use of a screen-printing method, the number of courses of the at least one lacquer layer 10 shown in FIGS. 3, 4A and 4B and also of the at least one lacquer layer 60 may be reduced by using, for example, coarser screens or a stencil printing.

For production of the flexible electrical circuits 2, 3, it is possible, as in the embodiment shown in FIG. 2, to use, in standard manner, six printing steps, with which the individual layers are applied additively on a siliconized carrier foil (liner). For production of the flexible electrical circuits shown in FIGS. 4A and 4B, two lacquer-printing steps are used first for production of the lacquer layers 61 and 62, followed by the printing of the electrical conductor track 20. Two further lacquer-printing steps follow for production of the lacquer layers 11 and 12. As the last printing step, the cement layer 70 is applied. In contrast to the production of the flexible electrical circuit according to FIG. 2, the primer layer 50 is added in the region of the conductive cement junction for production of the embodiments 2 and 3 of the flexible electrical circuit shown in FIGS. 4A and 4B, whereby a thermode must then also be used for curing.

During the production of the flexible electrical circuit, a thermode and if necessary an adhesive bead and/or adhesive dot may be selected that are longer than the region of the electrical conductor track 20 or respectively the region of the at least one electrically conductive layer 31 (bond pads) or the region 51 of the layer of primer, so that additional adhesive area is formed at the rims, i.e. in the regions 52 of the primer layer 50, as is shown in FIGS. 4A and 4B.

Figure 5A:
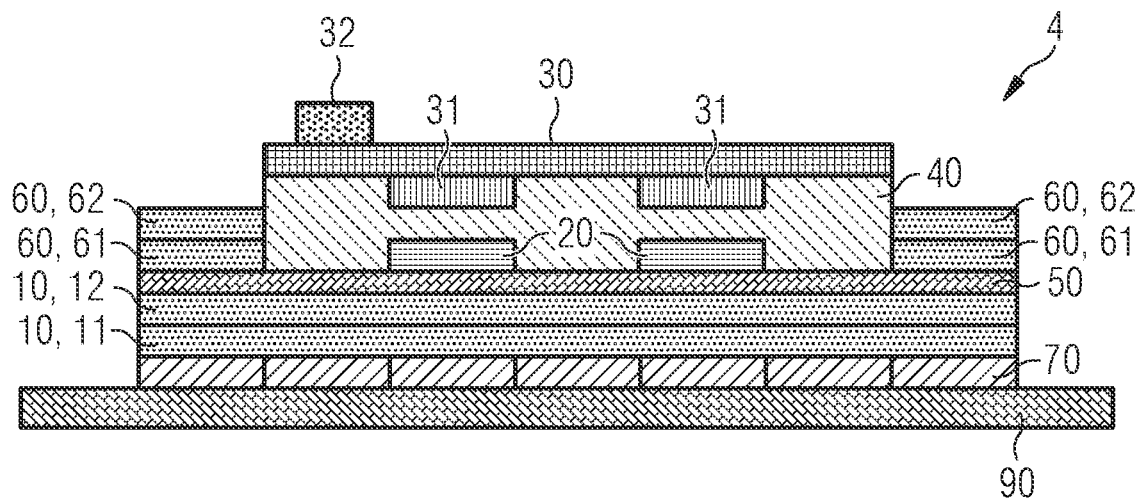
FIG. 5A shows an embodiment of a sensor arrangement containing the second embodiment of the flexible electrical circuit having connection between electrically conductive structure elements.
Figure 5B:
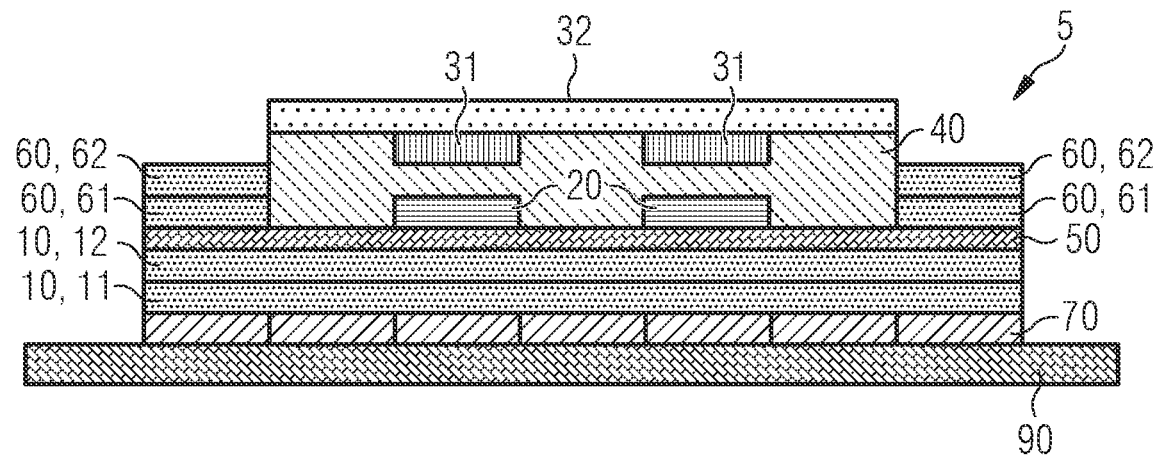
FIG. 5B shows an embodiment of a sensor arrangement containing the third embodiment of the flexible electrical circuit having connection between electrically conductive structure elements.

The flexible electrical circuit according to the embodiments 2 and 3 may be, for example, part of a sensor arrangement 4, 5. FIG. 5A shows a sensor arrangement 4 having the flexible electrical circuit 2 shown in FIG. 4A, which is adhesively bonded on a substrate 90 by the cement layer 70. FIG. 5B shows a sensor arrangement 5 having the flexible electrical circuit 3 shown in FIG. 4B, which is adhesively bonded on a substrate 90 by the cement layer 70. The substrate 90 may be a package, for example a medicine package. The flexible electrical circuit may be designed as a label with electrical functionality, which may be disposed on the substrate 90.

The flexible electrical circuit may be processed as roll material or as piece goods.

The flexible electrical circuits 2 or 3 may be dispensed in particular into a carton, in which a tablet blister is introduced and sealed. The at least one electrical component 32 may be designed in particular for monitoring the removal of tablets from the blister or respectively the carton. The at least one electrical component 32 may be, for example, a microcontroller, a communication chip, an antenna, a battery or respectively any other electrical device.

Although only a few embodiments of the present invention have been shown and described, it is to be understood that many changes and modifications may be made thereunto without departing from the spirit and scope of the invention.

What is claimed is:

1. A flexible electrical circuit having connection between electrically conductive structure elements, the flexible electrical circuit comprising:
   (a) at least one lacquer layer;
   (b) at least one electrical conductor track disposed above the at least one lacquer layer;
   (c) at least one electrical component;
   (d) at least one electrically conductive contact layer for contacting the at least one electrical component;
   (e) a conductive cement layer; and
   (f) a primer layer;

wherein the primer layer is directly disposed on the at least one lacquer layer;
   wherein the conductive cement layer is disposed underneath the at least one electrically conductive contact layer and above the primer layer;
   wherein the conductive cement layer is directly disposed on an upper side of the primer layer; and
   wherein the conductive cement layer is disposed between the at least one electrical conductor track and the at least one electrically conductive contact layer such that the conductive cement layer is in direct contact with the electrical conductor track and the electrically conductive contact layer.

2. The flexible electrical circuit according to claim 1, wherein an underside of the at least one electrical component is disposed on the conductive cement layer.

3. The flexible electrical circuit according to claim 2,
   wherein the at least one electrically conductive contact layer is disposed on the underside of the at least one electrical component; and
   wherein the at least one electrically conductive contact layer is disposed on the conductive cement layer.

4. The flexible electrical circuit according to claim 1, further comprising:
   a carrier layer, wherein the at least one electrical component is disposed on the carrier layer; and
   wherein the carrier layer is disposed on the conductive cement layer.

5. The flexible electrical circuit according to claim 4,
   wherein the at least one electrically conductive contact layer is disposed on an underside of the carrier layer; and
   wherein the at least one electrically conductive contact layer is disposed on the conductive cement layer.

6. The flexible electrical circuit according to claim 1, wherein the primer layer is disposed between the at least one lacquer layer and the at least one electrical conductor track.

7. The flexible electrical circuit according to claim 1, further comprising:
   at least one further lacquer layer disposed on an upper side of the primer layer;
   wherein the at least one lacquer layer is disposed on an underside of the primer layer.

8. The flexible electrical circuit according to claim 7,
   wherein the primer layer has a first region and a second region, wherein the first region has a first side and a second side and the second region is disposed on the first and second sides of the first region,
   wherein the at least one electrical conductor track is disposed on a third upper side of the first region of the primer layer; and
   wherein the conductive cement layer is disposed on an upper side of the second region of the primer layer.

9. The flexible electrical circuit according to claim 8,
   wherein the primer layer has a third region, wherein the third region is disposed next to the second region of the primer layer; and
   wherein the at least one further lacquer layer is disposed on an upper side of the third region of the primer layer.

10. The flexible electrical circuit according to claim 1,
    wherein the at least one electrical conductor track contains silver or carbon;
    wherein the at least one electrically conductive contact layer is designed as a silver layer or as a copper layer, which is coated with a gold layer or a tin layer or a zinc layer; and wherein the at least one lacquer layer contains polyurethane.

11. The flexible electrical circuit according to claim 1, further comprising:
a cement layer for adhesive bonding of the flexible electrical circuit on a substrate;
wherein the cement layer is disposed on an underside of the at least one lacquer layer; and
wherein the primer layer is disposed on an upper side of the at least one lacquer layer.

12. The flexible electrical circuit according to claim 11, further comprising:
a protective foil disposed, for protection of the cement layer, as a peelable foil underneath the cement layer.

13. A sensor arrangement, comprising:
a flexible electrical circuit according to claim 11; and
a substrate;
wherein the flexible electrical circuit is adhesively bonded by the cement layer on the substrate.

14. The sensor arrangement according to claim 13, wherein the substrate is a package.

15. The sensor arrangement according to claim 14, wherein the package is a medicine package.

\* \* \* \* \*